United States Patent
Koenigsmann et al.

(10) Patent No.: US 6,478,902 B2
(45) Date of Patent: Nov. 12, 2002

(54) FABRICATION AND BONDING OF COPPER SPUTTER TARGETS

(75) Inventors: Holger Koenigsmann, Congers, NY (US); Alfred Snowman, Englewood, NJ (US); Shailesh Kulkarni, Charlottesville, VA (US)

(73) Assignee: Praxair S.T. Technology, Inc., North Haven, CT (US)

( * ) Notice: Subject to any disclaimer, the term of this patent is extended or adjusted under 35 U.S.C. 154(b) by 51 days.

(21) Appl. No.: 09/730,349

(22) Filed: Dec. 5, 2000

(65) Prior Publication Data

US 2001/0023726 A1 Sep. 27, 2001

Related U.S. Application Data

(63) Continuation-in-part of application No. 09/349,687, filed on Jul. 8, 1999, now abandoned.

(51) Int. Cl.$^7$ .................................................. C22F 1/08
(52) U.S. Cl. ....................................... 148/681; 148/682
(58) Field of Search ................................. 148/681, 682; 204/298.12, 298.13

(56) References Cited

U.S. PATENT DOCUMENTS 5,089,057 A * 2/1992 Plewes ........................ 148/685

* cited by examiner

*Primary Examiner*—Sikyin Ip
(74) *Attorney, Agent, or Firm*—Blake T. Biederman

(57) ABSTRACT

The method is used to fabricate pure copper sputter targets. It includes first heating a copper billet to a temperature of at least 500° C. The copper billet has a purity of at least 99.99 percent. Then warm working the copper billet applies at least 40 percent strain. Cold rolling the warm worked copper billet then applies at least 40 percent strain and forms a copper plate. Finally, annealing the copper plate at a temperature above about 250° C. forms a target blank. The target blank has equiaxed grains having an average grain size of less than 40 μm. The grains of the target blank have (111), (200), (220) and (311) orientations with the amount of the grains having each of the orientations being less than 50 percent.

17 Claims, No Drawings

FABRICATION AND BONDING OF COPPER SPUTTER TARGETS

This is a continuation-in-part of application Ser. No. 09/349,687 filed Jul. 8, 1999, abandoned.

FIELD OF THE INVENTION

The present invention relates to a method of fabricating high purity copper sputter targets to both decrease particle generation in the sputtering process and enhance film uniformity on substrates, such as semiconductor wafers used in the manufacture of semiconductor devices and circuits.

BACKGROUND OF THE INVENTION

Sputtering refers to a process that involves the coating of a semiconductor wafer or other substrate mounted within a processing chamber. This chamber contains an inert gas ionized by an electric field and a sputter target spatially opposed to the wafer. The sputter target contains an electrical bias to the wafer. Ions from the gas bombard the target and dislodge atoms from the target to deposit target material onto the wafer.

In the manufacture of sputter targets used in the semiconductor industry, and more particularly sputter targets used in physical vapor deposition (PVD) of thin films onto complex integrated circuits, it is desirable to produce a sputter target that will provide: 1) film uniformity; 2) high deposition rates; 3) minimal particle generation during sputtering; and 4) good conductivity for connecting transistors. For example, sputtering aluminum and aluminum alloy sputter targets deposits thin electrically conductive films on integrated circuits for interconnect purposes. Copper, however, has the potential to become an alternative to aluminum in interconnect technology. Copper has both a higher electrical conductivity and a higher resistance to electromigration than aluminum. Other potential benefits of using copper interconnect films include the reduction of both power dissipation and interconnect signal delay.

Larger and less uniform grain sizes decrease target performance. Moreover, it is known that crystallographic orientation of the sputter target and the distribution of material ejected from the target affect film uniformity and sputter deposition rate. It is also known that the sputtering of atoms from the target occurs preferentially along the close packed directions of the target material and that a near random grain orientation provides better uniformity of the sputtered films.

Prior processes for producing aluminum or copper targets provide either (200) or (220) oriented crystalline structures. But targets having a strong (200) or (220) crystalline orientation, however, generate films having poor uniformity. Thus, it is desirable to have a target with a random or weak orientation.

To control grain size, copper sputter targets may contain second phase alloy precipitates of up to 10 $\mu$m in size. But poor conductivity of the large second phase precipitates can generate localized arcing during sputtering and deposit disadvantageous high density or large particles. Furthermore, the use of a second phase to control grain size does not provide effective control for copper targets having a purity of 99.99 percent or higher.

In a conventional target cathode assembly, a single bonding surface attaches the target to a nonmagnetic backing plate, typically an aluminum or copper backing plate. This forms a parallel interface between the sputter target and backing plate in the assembly. The backing plate provides a means for holding the target in the sputtering chamber and provides structural stability for the target. Also, water cooling the backing plate removes heat generated by the ion bombardment of the target. Attaching the target and the backing plate by a technique, such as soldering, brazing, diffusion bonding, clamping, screw fastening or epoxy cementing achieves good thermal and electrical contact between the target and the backing plate. Unfortunately, solder bonds are susceptible to debonding during the sputtering operation. Furthermore, the relatively low joining temperatures associated with the "soft" solders reduce the target's temperature range for sputtering. Thus, solder-bonded assemblies are more costly and time-consuming to the consumer because the target has to be used at a lower power level to prevent separation of the target from the backing plate. This results in a decreased sputtering rate.

Diffusion bonding, particularly with a pre-treated, roughened surface, provides a stronger bond. But preparation for diffusion bonding is time-consuming. More importantly, the high temperatures involved in diffusion bonding change the microstructure obtained during pre-bonding processing. Therefore, even if fine grain size and random orientation can be achieved during the target manufacturing stage, they are lost by current diffusion bonding techniques. For pure copper targets, the diffusion bonding has the effect of nearly doubling the grain size. Thus, debonding and alteration of the microstructural and metallurgical characteristics are significant disadvantages of prior diffusion bonding techniques that make them undesirable for copper target assemblies in which small, uniform grains are desirable in the sputter target.

The alternative of using monolithic sputter targets without backing plates also becomes less feasible in view of the continuing increase in target diameters required for sputtering larger size silicon wafers and the increasing purity requirements of target materials, which both result in an increased cost for monolithic targets.

There is thus a need to provide a method of fabricating pure copper target assemblies having a sputter target of fine, equiaxed, uniform grain structure and random crystallographic structure strongly bonded to a non-magnetic backing plate.

SUMMARY OF THE INVENTION

The method is used to fabricate pure copper sputter targets. It includes first heating a copper billet to a temperature of at least about 500° C. The copper billet has a purity of at least 99.99 percent. Then warm working the copper billet applies at least about 40 percent strain. Cold rolling the warm worked copper billet then applies at least about 40 percent strain and forms a copper plate. Finally, annealing the copper plate at a temperature above about 250° C. forms a target blank. The target blank has equiaxed grains having an average grain size of less than about 40 $\mu$m. The target blank's crystallographic structure contains grains of the (111), (200), (220) and (311) orientations with the amount of the target blank's grains having each of the orientations being less than about 50 percent.

DETAILED DESCRIPTION

Fabricating high purity copper by a process including the steps of heating, warm working, cold working and annealing produces a sputter target having fine, uniform grains in random orientation. This process applies these steps to high purity copper ingots, billets, plates or any other form suitable for subsequent working operations. The high purity copper has a purity of at least 99.99 percent. Advantageously, the copper has a purity of at least 99.999 percent. Most advantageously, the copper has a purity of at least 99.9999 percent for limiting the generation of impurity-containing particles. Most advantageously, explosion bonding this sputter target to a backing plate secures the backing plate without altering the size or orientation of the grains.

First, heating high purity copper to a temperature above about 500° C. prepares the copper for warm working. Advantageously, this step preheats the copper for at least one half an hour to ensure uniform heating. Furthermore, high purity copper billets with a thicker cross section may require a longer preheating time. Advantageously, heating the high purity copper to a temperature in the range of about 500 to 750° C. for a period of about 1 to 6 hours prepares the billet for warm working. Heating the high purity copper to a temperature in the range of about 600 to 700° C. for a period of about 1 to 6 hours improves the final grain size after annealing. Heating the copper billets to temperatures between 625 to 675° C. produces the most advantageous results. The atmosphere in which the material is preheated is not critical. The material may be heated under ambient conditions, or may be heated in a protective atmosphere so as to minimize oxidation.

The high purity copper material is then warm worked by applying at least a 40 percent strain to break down any remaining large grains at a temperature of at least 500° C. For purposes of this specification, warm working defines a temperature of applying strain that imparts energy into the copper without excessive cracking or excessive grain growth—under these conditions, partial recrystallization or near complete recrystallization may occur. Advantageously, warm working between about 40 and 80 percent strain, such as by hot pressing, hot forging, hot rolling, equi-channel angular extrusion or any other suitable metal working operation produces the best results. Warm working with less than 40 percent strain may not break down the grains sufficiently for subsequent cold working. steps, and warm working with strains above 80 percent will result in uncontrolled grain growth. Most advantageously, the warm working imparts between about 50 and 70 percent strain into the high purity copper. The amount of working as used herein is defined either as the ratio between the thickness reduction and the starting thickness, multiplied by 100 percent or as the amount of shear strain applied to the material. The hot working may be performed with or without intermediate annealing steps.

Warm working at temperatures below 500° C. will result in cracking and at temperatures above 750° C. will result in grain growth. Temperatures between about 500 and 750° C. provide effective grain size breakdown without excessive grain growth. Advantageously, warm working at temperatures between about 600 and 700° C. allows imparting a wide range of strain into the copper. Most advantageously, warm working occurs at a temperature between about 625 and 675° C. Again, the atmosphere in which the material is warm worked is not critical. The warm worked material is then allowed to cool to approximately room temperature by air cooling, oven cooling, quenching in water or quenching in any other medium.

The warm worked material is then cold rolled with at least about 40 percent strain to further break down the grains. For purposes of this specification, cold rolling defines rolling at temperatures with the copper at ambient conditions or preheated to temperatures of less than 250° C. Advantageously, cold rolling with about 40 to 80 percent strain and most advantageously, with about 50 to 70 percent strain further breaks down the grains and forms a target blank of desired final thickness. Most advantageously, cold rolling reduces the copper to a thickness of less than about 2 cm.

Cold rolling with the copper preheated to less than 250° C. prevents grain growth during cold rolling. Advantageously, cold rolling occurs with the copper preheated to less than 200° C. Most advantageously, cold rolling occurs under ambient conditions.

Annealing follows cold rolling with the target blank at a temperature above about 250° C. to obtain a final microstructure of fine, uniform grains and random orientation. Advantageously, annealing occurs at a temperature between about 250 and 400° C. and most advantageously between about 300 and 375° C. Too low of an annealing temperature will not recrystallize the copper and too high of a temperature will result in uncontrolled grain growth. As with the heating step, the target may be annealed under ambient conditions, or may be annealed in a protective atmosphere to minimize oxidation of the target material.

Advantageously, annealing for at least about one half an hour provides sufficient recrystallization. Typical commercial operations will use about a 0.5 to 12 hour anneal cycle. Most advantageously, the annealing occurs with about a 1 to 2 hour anneal cycle.

This process produces grains having a size of less than about 40 $\mu$m. Advantageously, the grains have a final size between about 10 and 35 $\mu$m. Most advantageously, the final grain size is about 10 to 30 $\mu$m.

The target's crystallographic structure after annealing contains grains of the (111), (200), (220) and (311) orientations. Advantageously, the amount of the target's grains having each of the above orientations is less than about 50 percent. Most advantageously, the amount of the target's grains having each of the above orientations is less than about 40 percent of each grain orientation. For example, the grains of typical targets advantageously have about 10 to 40 percent of each of the above grain orientations and most advantageously about 15 to 35 percent of each of the above grain orientations.

After annealing, the grains most advantageously have an aspect ratio, defined herein as the ratio between the length (in the cold rolling direction) divided by the width of the grains (transverse to the cold rolling direction), of less than about 1.5, and most advantageously less than about 1.3, which is indicative of equiaxed grains. While at an elevated temperature so as to avoid imparting additional work to the target material, the top and bottom surfaces of the target blank may be flattened, such as by pressing between two opposing plates at a pressure sufficient to even out the surfaces, but not to significantly reduce the thickness of the target.

Because the above process provides the target microstructure that is desirable for achieving good film uniformity and minimal particle generation during sputtering, the additional manufacturing steps to complete the target assembly must minimize any change to the microstructure. Specifically, the technique for bonding the target to a backing plate and any machining of the target to final dimensions should avoid the imposition of high temperature or additional working to the target material.

Thus, in accordance with further principles of the present invention, the target blank is explosion bonded to a backing plate of copper, aluminum or any other suitable metal or alloy. A suitable metal is one that has good thermal conductivity, high strength and modulus of elasticity, and whose coefficient of thermal expansion is compatible with that of copper. The explosion bond is achieved by placing a surface of the target in close proximity to a surface of the backing plate (i.e., with a small standoff space therebetween) and producing one or more controlled detonations to accelerate one or both of the surfaces toward each other. The explosion bonding method is fully explained in copending U.S. patent application Ser. No. 09/349,285, entitled "Method of Bonding a Sputtering Target to a Backing Plate," Paul S. Gilman et al., incorporated by reference herein in its entirety.

By this explosion bonding method, a strong atomic/metallurgical bond in the form of a wave-type morphology is created at the interface between the sputter target and the backing plate, but no alteration of the metallurgical properties of the sputter target or backing plate materials results except the local deformation that is inherent with the wave-type bond interface. The explosion bonding process occurs at non-elevated temperatures, and the heat generated from the process is generated for an insufficient time for heat transfer to the backing plate and target metals; therefore, there is no appreciable temperature increase in the target and backing plate metals to produce grain growth. Thus, the fine, oriented grains achieved by the processing of the target blank are not altered by the explosion bonding process, and yet a strong bond is achieved.

EXAMPLE 1

The tests relied upon square copper slabs having a length of 3.81 cm and a thickness of 5.31 cm. Sample A to D represent comparative examples and Samples Nos. 1 to 11 represent examples of the invention. Samples A to D and 1 to 8 had a purity of about 99 percent and Samples 9 to 11 had a purity of at least 99.999 percent.

TABLE 1

| Sample ID | Hot Press | Temp. (° C.) | Calc. (cm) | Actual (cm) | Cold Roll | Calc. (cm) | Actual (cm) |
|---|---|---|---|---|---|---|---|
| A | None | | | | 90% | 0.531 | 0.510 |
| B | None | | | | 90% | 0.531 | 0.510 |
| C | None | | | | 90% | 0.531 | 0.510 |
| D | None | | | | 90% | 0.531 | 0.510 |
| 1 | 60% | 650 | 2.12 | 2.11 | 60% | 0.848 | 0.838 |
| 2 | 60% | 650 | 2.12 | 2.11 | 60% | 0.848 | 0.838 |
| 3 | 60% | 650 | 2.12 | 2.11 | 60% | 0.848 | 0.838 |
| 4 | 60% | 650 | 2.12 | 2.11 | 60% | 0.848 | 0.838 |
| 5 | 60% | 650 | 2.12 | 2.11 | 70% | 0.638 | 0.599 |
| 6 | 60% | 650 | 2.12 | 2.11 | 70% | 0.638 | 0.599 |
| 7 | 60% | 650 | 2.12 | 2.11 | 70% | 0.638 | 0.599 |
| 8 | 60% | 650 | 2.12 | 2.11 | 70% | 0.638 | 0.599 |
| 9 | 60% | 650 | 2.12 | 2.11 | 60% | 0.848 | 0.838 |
| 10 | 60% | 650 | 2.12 | 2.11 | 70% | 0.638 | 0.599 |
| 11 | 60% | 650 | 2.12 | 2.11 | 70% | 0.638 | 0.599 |

Table 2 illustrate the final effect of annealing temperature on grain size.

TABLE 2

| Sample ID | Anneal Temp. (° C.) | Time (hours) | Grain Size ($\mu$m) |
|---|---|---|---|
| A | 300 | 1 | 17 |
| B | 300 | 2 | 19 |
| C | 350 | 1 | 20 |
| D | 350 | 2 | 20 |
| 1 | 350 | 1 | 16 |
| 2 | 350 | 2 | 17 |
| 3 | 400 | 1 | 19 |
| 4 | 400 | 2 | 19 |
| 5 | 350 | 1 | 16 |
| 6 | 350 | 2 | 16 |
| 7 | 400 | 1 | 17 |
| 6 | 400 | 2 | 19 |
| 9 | 350 | 1 | 14 |
| 10 | 350 | 1 | 14 |
| 11 | 350 | 2 | 14 |

The process tabulated in Tables 1 and 2 provided an effective means for controlling grain size in 99.99 and 99.999 percent pure copper. In addition, this process produce copper having an equiaxed grain structure and less than 50 percent each of the (111), (200), (220) and (311) orientations. Comparative samples A to D, lacking the hot pressing, contained greater than 50 percent grains oriented in the (220) direction.

EXAMPLE 2

The test also included several series of 99.9999 percent pure copper slabs. Due to lack of impurities that pin grains and prevent grain growth, these copper slabs require closer process control. This test relied upon round cross-section slabs having a diameter of 15.56 cm and a thickness of 4.98 cm. All samples were placed into a furnace heated to temperature and annealed for one hour.

The experiments shown in Tables 3 and 4 below test the effect of annealing temperature on the process of the invention.

TABLE 3

| Sample ID | Hot Press | Temp. (° C.) | Calc. (cm) | Actual (cm) | Total Cold Roll | 1st Cold Roll | Calc. (cm) | Actual (cm) | Anneal Temp. (° C.) | 2nd Cold Roll | Calc. (cm) | Actual (cm) | Anneal Temp. (° C.) |
|---|---|---|---|---|---|---|---|---|---|---|---|---|---|
| E | 60% | 650 | 1.99 | 2.07 | 60% | 37% | 1.303 | 1.311 | 600 | 37% | 0.826 | 0.826 | 500 |
| F | 60% | 650 | 1.99 | 2.07 | 60% | 37% | 1.303 | 1.311 | 500 | 37% | 0.826 | 0.826 | 400 |
| G | 60% | 650 | 1.99 | 2.07 | 60% | 37% | 1.303 | 1.311 | 450 | 37% | 0.826 | 0.826 | 400 |
| 12 | 60% | 650 | 1.99 | 2.07 | 60% | 37% | 1.303 | 1.311 | 400 | 37% | 0.826 | 0.826 | 350 |

TABLE 4

| Sample ID | Hot Press | Temp. (° C.) | Calc. (cm) | Actual (cm) | Cold Roll | Calc. (cm) | Actual (cm) | Anneal Temp. (° C.) |
|---|---|---|---|---|---|---|---|---|
| H1 | 60% | 650 | 1.99 | 2.07 | 60% | 0.828 | 0.838 | 500 |
| 13 | 60% | 650 | 1.99 | 2.07 | 60% | 0.828 | 0.838 | 400 |

TABLE 5

| Sample ID | Anneal Temp (° C.) | Time (hours) | Grain Size Parallel (μm) | Grain Size Normal (μm) |
|---|---|---|---|---|
| E | 600/500 | 1/1 | 179 | 216 |
| F | 500/400 | 1/1 | 103 | 97 |
| G | 450/400 | 1/1 | 42 | 43 |
| H | 500 | 1 | 163 | 166 |
| 12 | 400/350 | 1/1 | 35 | 34 |
| 13 | 400 | 1 | 35 | 32 |

Table 5 illustrates that maintaining an annealing temperature below about 425° C. provides the optimum final grain size. Furthermore, the process operates with a single or multiple annealing steps.

EXAMPLE 3

A 99.999 percent pure copper billet having a diameter of 12.70 cm and a height of 10.16 cm was heated under ambient conditions to a temperature of 650° C. for about 1 hour. The material was then hot pressed 60 percent under ambient conditions without intermediate annealing. The pressed material was then cooled in air, followed by cold rolling to a 60 percent reduction. The target blank was then annealed under ambient conditions at a temperature of 350° C. for about 2 hours, flattened between two opposing plates, and explosion bonded to an aluminum backing plate. The sputter target/backing plate assembly displayed a sputter target with an average grain size of about 25 μm and an aspect ratio of 1.05, which was obtained during the target processing and maintained during the explosion bonding process. The crystallographic structure observed showed equal ratios of the (111), (200), (220) and (311) orientations.

While the present invention has been illustrated by the description of an embodiment thereof, and while the embodiment has been described in considerable detail, it is not intended to restrict or in any way limit the scope of the appended claims to such detail. Additional advantages and modifications will readily appear to those skilled in the art. The invention in its broader aspects is therefore not limited to the specific details, representative apparatus and method and illustrative examples shown and described. Accordingly, departures may be made from such details without departing from the scope or spirit of applicants' general inventive concept.

What is claimed is:

1. A method of fabricating copper sputter targets comprising the steps of:
   heating a copper billet to at least about 500° C., the copper billet having a purity of at least 99.99 percent;
   warm working the heated copper billet to apply at least about 40 percent strain;
   cold rolling the warm worked copper billet to apply at least about 40 percent strain and to form a copper plate; and
   annealing the copper plate at a temperature above about 250° C. to form a target blank, the target blank having equiaxed grains, the grains having an average grain size of less than about 40 μm and having (111), (200), (220) and (311) orientations with the amount of the grains having each of the orientations being less than about 50 percent.

2. The method of claim 1, wherein the copper billet is heated to a temperature between about 500 and 750° C.

3. The method of claim 1, wherein the warm working introduces about 40 to 80 percent strain into the copper billet.

4. The method of claim 3, wherein the warm working is a technique selected from the group consisting of: pressing, forging, equi-channel angular extrusion and rolling.

5. The method of claim 1, wherein the cold rolling introduces between about 40 and 80 percent strain into the copper plate.

6. The method of claim 1, wherein the annealing occurs at a temperature between about 250 and 400° C.

7. A method of fabricating copper sputter targets comprising the steps of:
   heating a copper billet to a temperature between about 500 and 750° C., the copper billet having a purity of at least 99.999 percent;
   warm working the heated copper billet to between about 40 and 80 percent strain;
   cold rolling the warm worked copper billet to apply between about 40 and 80 percent strain and to form a copper plate; and
   annealing the copper plate at a temperature between about 250 and 400° C. to form a target blank, the target blank having equiaxed grains, the grains having an average grain size between about 10 and 35 μm and having (111), (200), (220) and (311) orientations with the amount of the grains having each of the orientations being less than about 50 percent.

8. The method of claim 7, wherein the copper billet is heated to a temperature between about 600 and 700° C.

9. The method of claim 7, wherein the warm working introduces about 50 to 70 percent strain into the copper billet.

10. The method of claim 9, wherein the warm working is a technique selected from the group consisting of: pressing, forging, equi-channel angular extrusion and rolling.

11. The method of claim 7, wherein the cold rolling introduces between about 50 and 70 percent strain into the copper plate.

12. The method of claim 7, wherein the annealing occurs at a temperature between about 300 and 375° C.

13. A method of fabricating copper sputter targets comprising the steps of:
   heating a copper billet to a temperature between about 600 and 700° C., the copper billet having a purity of at least 99.999 percent;
   warm working the heated copper billet to between about 50 and 70 percent strain, the heated billet having a temperature between about 600 and 700° C.;
   cold rolling the warm worked copper billet to apply between about 50 and 70 percent strain and to form a copper plate; and
   annealing the copper plate at a temperature between about 300 and 375° C. to form a target blank, the target blank having an average grain size of between about 10 and 30 μm and the target blank containing grains having the (111), (200), (220) and (311) orientations with the amount of the grains having each of the orientations being less than about 50 percent.

14. The method of claim 13, wherein the warm working is pressing.

15. The method of claim 13, wherein the amount of grains with the (111), (200), (220) and (311) orientations is between about 15 and 35 percent.

16. The method of claim 13, including the additional steps of:

flattening the target blank at the elevated temperature; and explosion bonding the target blank to a backing plate.

17. The method of claim 1 wherein the target blank has a thickness of less than about 2 cm and the grains have an aspect ratio of less than about 1.5.

* * * * *